(12) United States Patent
Goto

(10) Patent No.: US 6,340,617 B1
(45) Date of Patent: Jan. 22, 2002

(54) MANUFACTURE OF SEMICONDUCTOR DEVICE

(75) Inventor: Kenichi Goto, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/450,507

(22) Filed: Nov. 30, 1999

(30) Foreign Application Priority Data

Nov. 30, 1998 (JP) ............................................. 10-340114

(51) Int. Cl.⁷ ............................................. H01L 21/336
(52) U.S. Cl. ....................... 438/303; 438/304; 438/305; 438/306; 438/307; 438/592; 438/595; 438/596
(58) Field of Search ................................ 438/303–307, 438/592, 595, 596

(56) References Cited

U.S. PATENT DOCUMENTS

| | | | |
|---|---|---|---|
| 6,087,234 A | * 7/2000 | Wu ............................. | 438/305 |
| 6,121,090 A | * 9/2000 | Wu ............................. | 438/305 |
| 6,156,593 A | * 12/2000 | Peng et al. .................. | 438/305 |
| 6,162,689 A | * 12/2000 | Kepler et al. ................ | 438/306 |

FOREIGN PATENT DOCUMENTS

JP    3-270137    12/1991

* cited by examiner

Primary Examiner—John F. Niebling
Assistant Examiner—Lynne A. Gurley
(74) Attorney, Agent, or Firm—Armstrong, Westerman, Hattori, McLeland & Naughton LLP

(57) ABSTRACT

A method of manufacturing a semiconductor device having shallow p-n junctions and silicide regions, capable of meeting both requirements of a high annealing temperature and a low annealing temperature. A lamination of two films made of materials having different etching characteristics is formed on the surface of a silicon substrate, covering an insulated gate electrode structure. The upper film is anisotropically etched to form side wall spacers. Impurity ions are implanted into a surface layer of the silicon substrate and sufficiently activated to a first level. The lower film is removed by using as a mask the side wall spacers, and a metal film capable of being silicided is deposited to perform a first silicidation reaction. The insulated gate electrode is exposed and impurity ions are implanted shallowly in the surface layer of the silicon substrate. The impurities are activated to a second level lower than the first level to perform at the same time a second silicidation reaction for silicide formed by the first silicidation reaction.

13 Claims, 6 Drawing Sheets

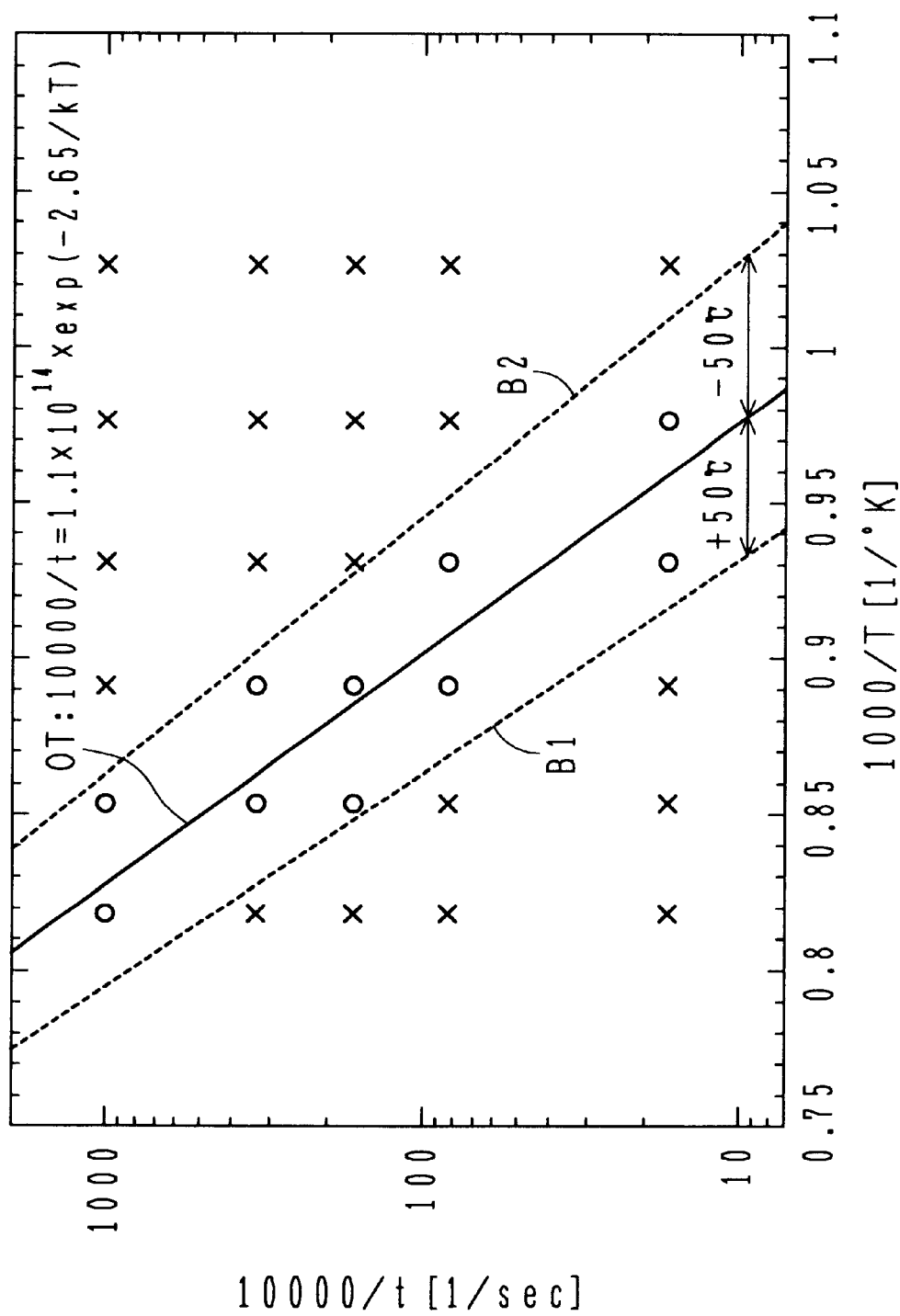

MANUFACTURE OF SEMICONDUCTOR DEVICE

This application is based on Japanese Patent Application No. HEI 10-340114, filed on Nov. 30, 1998, the entire contents of which are incorporated herein by reference.

BACKGROUND OF THE INVENTION a) Field of the Invention

The present invention relates to a method of manufacturing a semiconductor device, and more particularly to a method of manufacturing a semiconductor device having shallow junctions and silicide regions.

b) Description of the Related Art

High integration and high performance of semiconductor integrated circuits have been realized by using micro fine elements. Most of semiconductor integrated circuits have MOS transistors, particularly CMOS transistors. As the integration degree becomes high, concentration of an electric field near the drain becomes intense and the reliability is likely to be degraded. In order to relax this electric field concentration, a MOS transistor having a lightly doped drain (LDD) structure to be described hereinunder has been adopted.

An insulated gate electrode structure is first formed on a silicon substrate. By using this gate electrode as a mask, impurities are implanted lightly and shallowly in LDD regions. Thereafter, an insulating film is formed on the silicon substrate surface, covering the insulated gate electrode, and anisotropically etched to form side wall spacers on the side walls of the gate electrode. By using the insulated gate electrode structure and side wall spacers as a mask, impurity ions are implanted to form high impurity concentration source/drain regions.

After the two ion implantation processes, an annealing process is performed to activate the implanted impurity atoms. With the above processes, a MOS transistor having an LDD structure can be formed. A CMOS transistor having an LDD structure can be formed by performing ion implantation processes separately for an n-channel transistor and a p-channel transistor by using a resist mask or the like.

In order to realize a high performance of a transistor, it is desired to suppress a depletion region from being generated in a lower region of the gate electrode, to lower the source/drain resistance, and to lower the contact resistance of the source/drain region and gate electrode. In order to realize this, it is effective to activate implanted impurities at a high annealing temperature after the impurity ion implantation processes.

In order to suppress the short channel effect, it is desired to form the regions of the LDD structure having a low impurity concentration and p-n junctions thereof at a shallow depth from the substrate surface. In order to realize this, it is necessary to suppress diffusion of impurity ions (atoms) after they are implanted. In order to suppress the impurity diffusion, it is necessary to lower the annealing temperature for impurity activation.

A high annealing temperature is desired for the former requirements, whereas a low annealing temperature for impurity activation is desired for the latter requirements.

In order to improve the fundamental performances of a MOS transistor, the following conditions are necessary. In order to sufficiently activate impurities, an annealing temperature after the ion implantation processes is set high. In order to suppress the short channel effect, impurity ions are implanted to a shallow depth to form the LDD regions having the low impurity concentration at a shallow depth and in addition an annealing temperature for impurity activation is set low to suppress impurity diffusion.

SUMMARY OF THE INVENTION

It is an object of the present invention to provide a method of manufacturing a semiconductor device capable of meeting both the requirements of a high annealing temperature and a low annealing temperature.

It is another object of the present invention to provide a method of manufacturing a semiconductor device having MOS transistors capable of forming LDD regions having shallow p-n junctions and reducing the resistance of main regions.

According to one aspect of the present invention, there is provided a method of manufacturing a semiconductor device comprising the steps of: (a) forming an insulated gate electrode structure on a surface of a silicon substrate; (b) laminating two or more films made of materials having different etching characteristics on the surface of the silicon substrate, the films covering the insulated gate electrode structure; (c) anisotropically etching two or more films made of different materials to form at least one film of one material covering the insulated gate structure and the silicon substrate and form side wall spacers on side walls of the insulated gate electrode structure, the side wall spacers being made of the remaining film or films of other material or materials; (d) implanting impurity ions into a surface layer of the silicon substrate by using as a mask the insulated gate electrode structure and the side wall spacers; (e) activating the implanted impurities to a first level; (f) removing the at-least-one film of one material by using as a mask the side wall spacers to expose an upper surface of the insulated gate electrode structure and a partial surface area of the silicon substrate; (g) forming a metal film capable of being silicided on the surface of the silicon substrate, the metal film covering the exposed surface of the silicon substrate and the insulated gate electrode structure; (h) performing a first silicidation reaction between the metal film and the exposed surface of the silicon substrate; (i) removing an unreacted portion of the metal film and the at-least-one film under the unreacted portion; (j) implanting impurity ions shallowly in the surface layer of the silicon substrate by using as a mask the insulated gate electrode structure; and (k) activating the shallowly implanted impurities to a second level lower than the first level to perform at a same time a second silicidation reaction for silicide formed by the first silicidation reaction.

Regions of the LDD structure having a high impurity concentration are first formed, and then regions of the LDD structure having a low impurity concentration are formed. The regions having the high impurity concentration are activated at a high annealing temperature to realize the low resistance of main regions. The regions having the low impurity concentration are activated at a low temperature to prevent p-n junctions from moving deep into the substrate.

The annealing process for forming shallow p-n junctions is performed by using a heat treatment for the silicidation reaction. It is therefore possible to form shallow p-n junctions and silicide regions with a simple process.

As above, shallow LDD p-n junctions can be formed so that an electric field concentration near the drain can be relaxed. The silicide regions connected to the high impurity concentration regions and gate electrode with low resistance can be realized. A high performance MOS transistor can therefore be provided.

BRIEF DESCRIPTION OF THE DRAWINGS

FIG. 5 is a graph showing preferred conditions for a second silicidation reaction.

DETAILED DESCRIPTION OF THE PREFERRED EMBODIMENTS

Embodiments of the invention will be described with reference to the accompanying drawings.

Figure 1A:
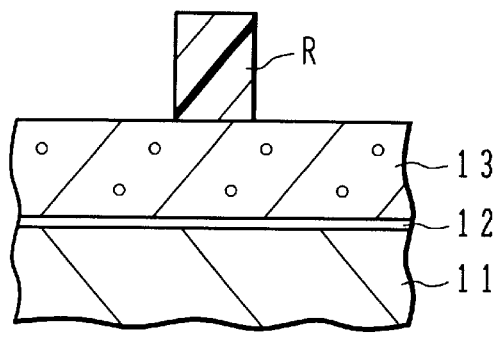
FIGS. 1A to 1F and FIGS. 2A to 2F are cross sectional views of a silicon substrate illustrating main processes of a method of manufacturing a semiconductor device according to an embodiment of the invention.

As shown in FIG. 1A, on the surface of a silicon substrate 11, a gate insulating film 12 having a thickness of, for example, 3 nm, is formed through thermal oxidation. On this gate oxide film 12, a polysilicon layer 13 is deposited by chemical vapor deposition (CVD) to a thickness of, for example, about 200 nm. On this polysilicon layer 13, a resist film is coated, exposed and developed to form a resist pattern R. The resist pattern R has a shape corresponding to a gate electrode structure.

Figure 1D:
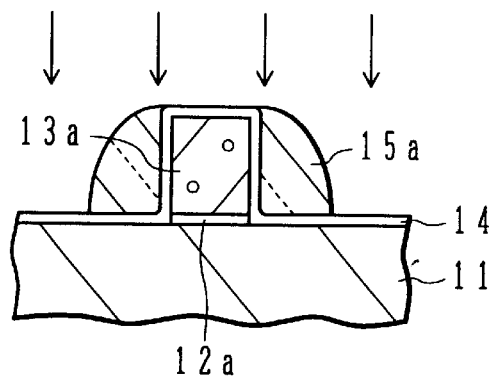
Figure 1B:
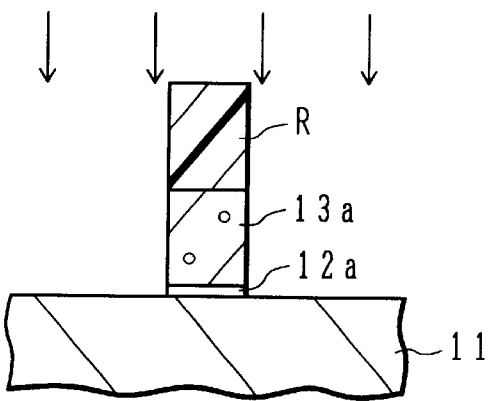

As shown in FIG. 1B, by using the resist pattern R as an etching mask, the polysilicon layer 13 is anisotropically etched through known reactive ion etching (RIE) to pattern a gate electrode 13a. The gate insulating film 12 under the polysilicon layer 13 is also patterned when necessary to leave a gate insulating film 12a. After this etching, the resist mask R is removed.

Figure 1E:
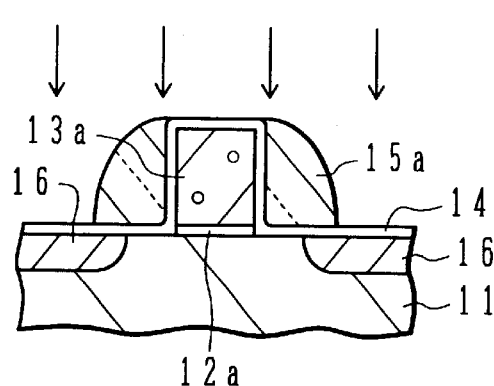
Figure 1C:
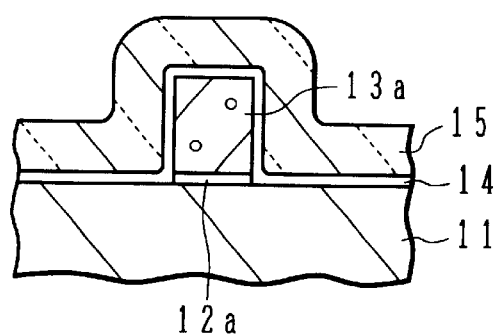

As shown in FIG. 1C, a TiN layer 14 functioning as an etching stopper is deposited on the surface of the silicon substrate 11 to a thickness of, for example, about 20 nm, covering the patterned gate electrode 13a. On the surface of the TiN layer 14, an insulating film 15 is deposited to a thickness of about 100 nm to form side wall spacers. For example, this insulating film 15 is a silicon oxide film formed by CVD.

It is important that the two films 14 and 15 formed over the substrate are made of materials having different etching characteristics. It is desired that when the upper film 15 is etched, the lower film 14 functions as the etching stopper and is left unetched even if the surface of this lower film 14 is exposed. TiN and $SiO_2$ are a typical example of a suitable combination of different materials. A combination of two materials is not limited only to this example, but other combinations such as an oxide film and a nitride film may also be used. Films may be laminated by using three or more materials. In this case, when at least one upper film made of one material is etched, it is desired that at least one lower film made of another material functions as the etching stopper.

As shown in FIG. 1D, the silicon oxide film 15 is anisotropically etched by RIE. When the silicon oxide film on the substrate flat surface is etched, silicon oxide films 15a are left on the side walls of the gate electrode 13a as shown in FIG. 1D. In this case, the TiN film 14 is exposed in the regions on the gate electrode 13a and outside the side wall spacers 15a.

For example, if an etching gas of $CF_4+CHF_3+Ar$ is used for anisotropically etching the $SiO_2$ film 15, the TiN film 14 is hardly etched. Therefore, the silicon surface is not exposed even after the $SiO_2$ film 15 is removed, and is being covered with the TiN film 14.

As shown in FIG. 1E, impurity ions are implanted to form impurity doped regions 16 in the surface layer of the silicon substrate 11, by using as a mask the gate electrode 13a, the TiN film 14 and side wall spacers 15a on the side walls of the gate electrode. At this time, the impurity ions are also implanted into the gate electrode 13a.

For example, for an n-channel MOS transistor, arsenic As ions are implanted under the conditions of an acceleration energy of 40 keV and a dose of $1\times10^{15}$ $cm^{-2}$, and for a p-channel MOS transistor, boron B ions are implanted under the conditions of an acceleration energy of 5 keV and a dose of $1\times10^{15}$ $cm^{-2}$. The impurity doped regions 16 are formed in the silicon substrate 11 outside of the side wall spacers 15a. Here, some portion of the implanted ions being distributed also under the both sides of the side wall spacers 15a.

Figure 1F:
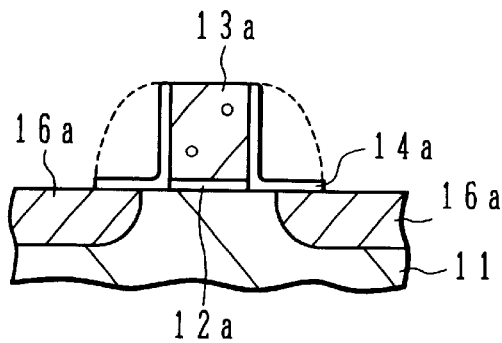

As shown in FIG. 1F, after the ion implantation, the substrate is heated for 10 seconds at a substrate temperature of 1050° C. to activate implanted impurity atoms sufficiently, for example, by rapid thermal annealing (RTA). In order to activate impurity atoms sufficiently, it is desired that an annealing temperature is set to 1000° C. or higher. The impurity doped regions 16a constitute high impurity concentration source/drain regions.

The impurity atoms implanted into the gate electrode 13a are also activated so that the gate electrode having a low resistance can be formed. With the gate electrode sufficiently doped with impurity atoms, a depletion layer is formed less upon application of a voltage and the gate electrode demonstrates the desired characteristics that the channel region can be controlled efficiently.

After the annealing process for impurity activation, the exposed TiN film 14 not covered with the side wall spacers 15a is removed by using sulfuric acid or the like. In this state, the upper surface of the gate electrode 13a and the main surfaces of the high impurity concentration regions 16a are exposed. Thereafter, the side wall spacers 15a are removed by using diluted hydrofluoric acid, when necessary. The side wall spacers 15a may not be removed at this stage, but they may be removed later. In any case, the TiN film 14a covered by the side wall spacers 15a is left and used later as a mask during a silicidation process.

Figure 2A:
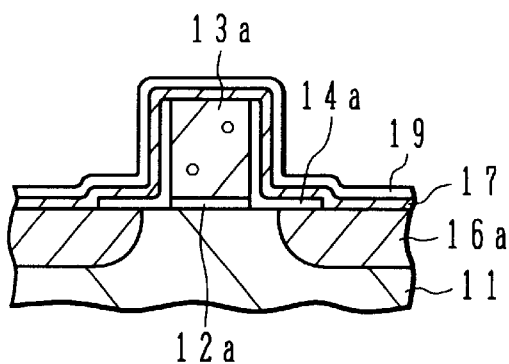

As shown in FIG. 2A, a Co film 17 is deposited to a thickness of, for example, about 10 nm over the silicon substrate, covering the exposed silicon substrate surface and gate electrode upper surface. On this Co film 17, a protective TiN film 19 is deposited. The Co film 17 is in direct contact with the main surfaces of the impurity doped regions 16a and the upper surface of the gate electrode 13a.

Figure 2D:
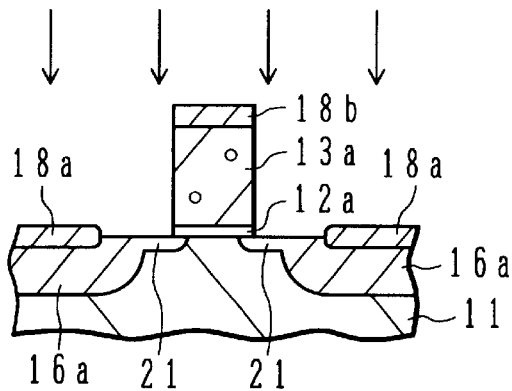
Figure 2B:
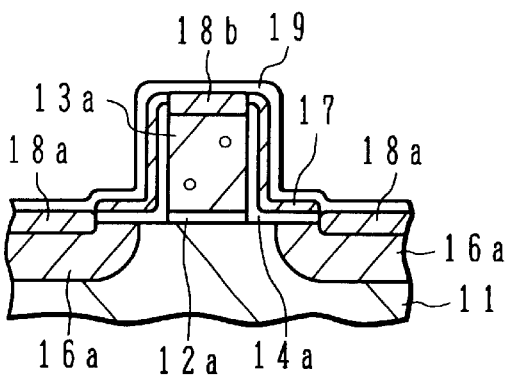

As shown in FIG. 2B, a heat treatment for a first silicidation reaction is executed, for example, at 500° C. Co reacts with Si to form Co silicide. It is preferable to use the conditions not forming $CoSi_2$. With this first silicidation reaction, Co silicide layers 18a are formed on the high impurity concentration source/drain regions 16a and a Co silicide layer 18b is formed on the upper surface of the gate electrode 13a.

Figure 4:
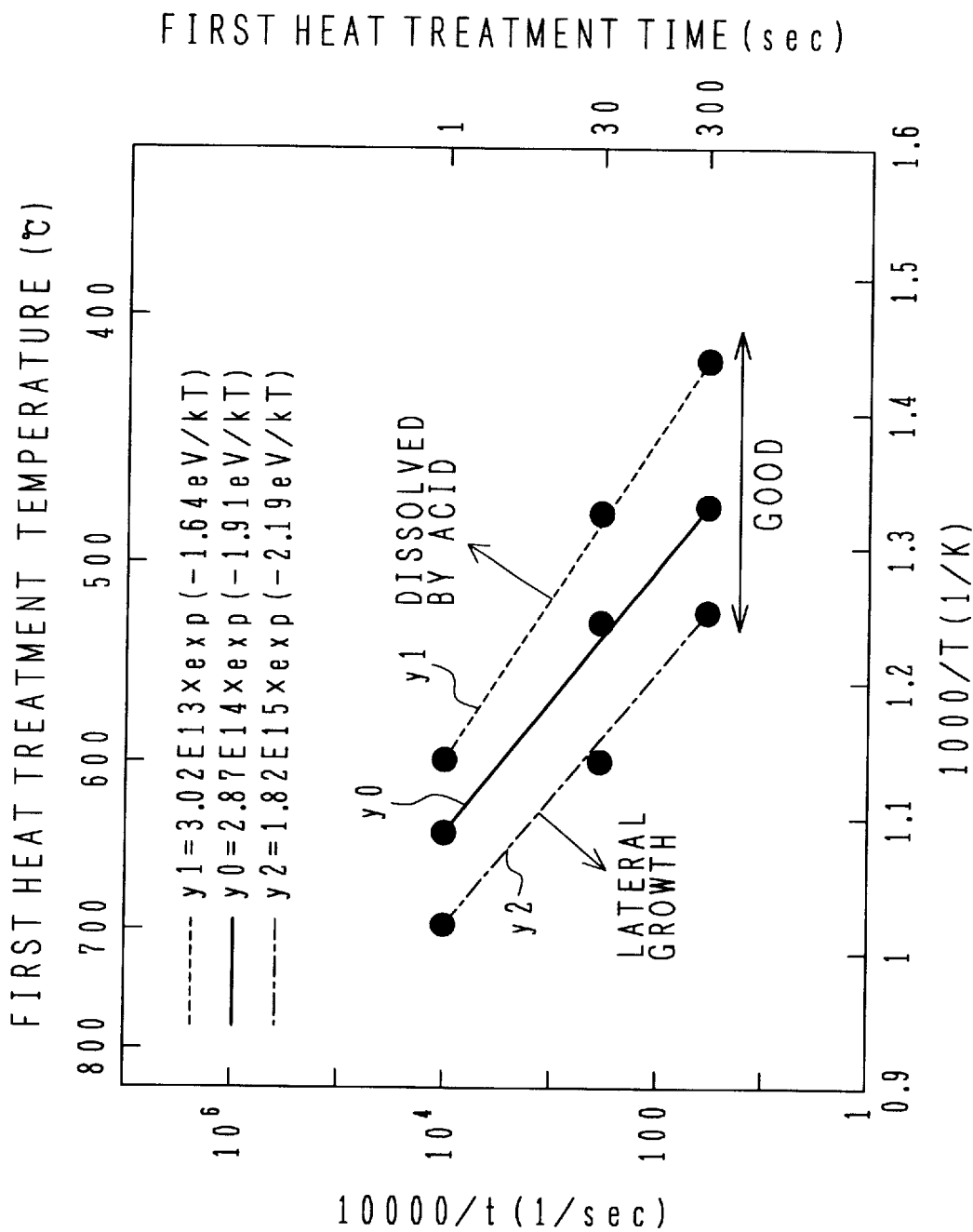
FIG. 4 is a graph showing preferred conditions for a first silicidation reaction.

FIG. 4 shows a range of the heat treatment conditions preferable to the first silicidation reaction. The abscissa represents a first heat treatment temperature, and the ordinate represents a first heat treatment time. In FIG. 4, a straight line y1 is represented by:

$$y1=3.02\times10^{13}\times\exp(-1.64\text{ eV/kT}),$$

and a straight line y2 is represented by:

$$y2=1.82\times10^{15}\times\exp(-2.19\text{ eV/kT}).$$

The range between these two straight lines is the range of the heat treatment conditions preferable to the first silicidation reaction. The optimum heat treatment conditions are represented by a straight line y0:

$$y0=2.87\times10^{14}\times\exp(-1.91\text{ eV/kT}).$$

If the heat treatment is performed for a shorter time at a lower temperature than those of the straight line y1, silicide formed is likely to be dissolved by acid which is used when unreacted Co is removed. If the heat treatment is performed for a longer time at a higher temperature than those of the straight line y2, silicide grows in the lateral direction, which is likely to degrade the dimension precision. Therefore, the range of the preferred heat treatment conditions is the range between the straight lines y1 and y2. The range near the straight line y0 is the optimum range for the heat treatment conditions. Under such heat treatment conditions, Co is silicided to Co silicide, and $CoSi_2$ is rarely formed.

Figure 2E:
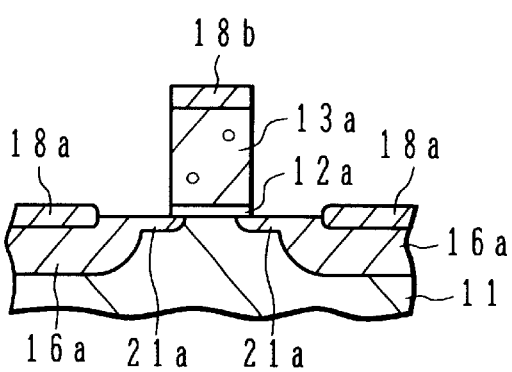
Figure 2C:
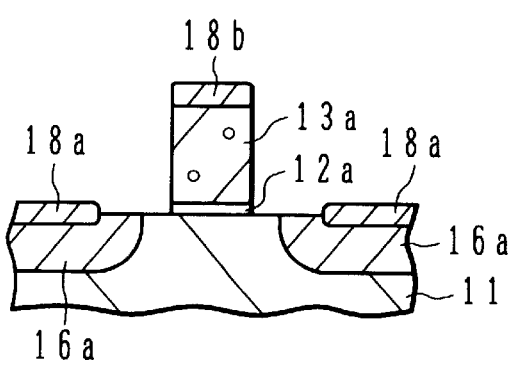

As shown in FIG. 2C, after the first silicidation reaction, the TiN film 19 and unreacted Co film 17 are removed by using sulfuric acid. At this time, the TiN film 14a used as a salicide mask for defining the silicide regions is also removed.

If the $SiO_2$ films 15a used as the side wall spacers were not removed at the process shown in FIG. 1F, they are removed by using diluted hydrofluoric acid at the process shown in FIG. 2C when the $SiO_2$ films 15a are exposed. The TiN films 14a under the $SiO_2$ films 15a can be removed by using sulfuric acid.

As shown in FIG. 2D, by using the exposed gate electrode as a mask, impurity ions are implanted for forming the low impurity concentration regions of the LDD structure. For example, for an n-channel MOS transistor, arsenic As ions are implanted under the conditions of an acceleration energy of 5 keV and a dose of $1\times10^{13}$ $cm^{-2}$, and for a p-channel MOS transistor, decaborane ions are implanted under the conditions of an acceleration energy of 5 keV and a dose (boron base) of $1\times10^{13}$ $cm^{-2}$ or $BF_2$ ions are implanted under the conditions of an acceleration energy of 1 keV and a dose of $1\times10^{13}$ $cm^{-2}$. It is preferable to set the implantation depth shallow by setting the ion acceleration energy to 5 keV or smaller.

With this ion implantation, low impurity concentration regions 21 are formed shallowly in the regions nearer to the gate electrode side than the high impurity concentration source/drain regions 16a. Although the same ions are also implanted shallowly in the regions already doped with the impurity atoms at a high concentration, no substantial effect appears because of a small relative dose.

As shown in FIG. 2E, implanted impurity ions are activated to form low impurity concentration regions 21a. This activation process is performed at a lower temperature than that of the activation process shown in FIG. 1F. For example, a heat treatment is performed for 10 seconds at 900° C.

The conditions of this heat treatment are preferably selected so that although implanted impurity atoms are activated to some degree, they are not substantially diffused. In order not to substantially diffuse impurity atoms, it is desired to set the heat treatment temperature to 950° C. or lower.

With this low temperature annealing, the low impurity concentration LDD regions 21a are formed shallowly between the high impurity concentration source/drain regions 16a and the channel region just under the gate electrode 13a. These low impurity concentration LDD regions 21a effectively relax the electric field concentration and guarantee the high performance of MOS transistors. This low temperature annealing activates impurities and also conducts a second silicidation reaction for the silicide layers 18a and 18b.

A heat treatment for the second silicidation reaction is desired to be performed under the predetermined conditions. If the heat treatment for the second silicidation reaction is performed at a low temperature, leak current of a p-n junction does not reduce, and if it is performed at a proper temperature, the leak current reduces, whereas if it is performed at a high temperature, the leak current increases. The factor of generating the leak current at the low temperature may be ascribed to spikes penetrating through the p-n junction. The factor of generating the leak current at the high temperature may be ascribed to re-diffusion of Co from once formed silicide.

FIG. 5 shows the heat treatment conditions preferable to the second silicidation reaction. The abscissa represents an annealing temperature, and the ordinate represents an annealing time.

The optimum conditions OT can be expressed by:

$$10000/t=1.1\times10^{14}\exp(-2.65/kT) \qquad (1),$$

the boundary conditions B1 can be expressed by:

$$10000/t=1.1\times10^{14}\exp(-2.65/k(T+50)) \qquad (2),$$

and the boundary conditions B2 can be expressed by:

$$10000/t=1.1\times10^{14}\exp(-2.65/k(T+50)) \qquad (3).$$

The heat treatment for the second silicidation reaction is preferably performed in the range between the straight lines B1 and B2, in the range of ±50 degrees of the optimum conditions OT, and most preferably performed near the straight line OT.

Figure 2F:
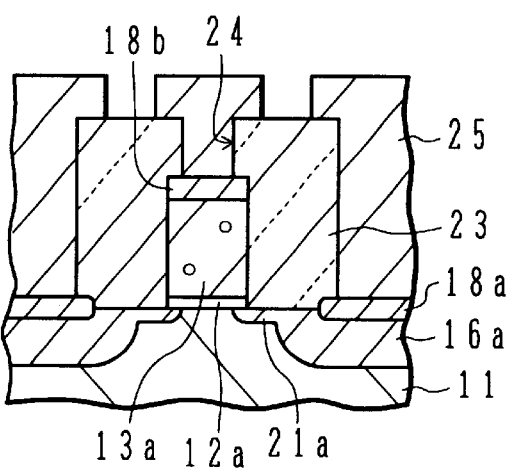

As shown in FIG. 2F, an interlayer insulating film 23 is formed covering the MOS transistor, and contact holes 24 are selectively formed through the interlayer insulating film 23. A wiring layer is deposited on the interlayer insulating film 23 and patterned to form necessary electrodes and wiring 25.

The material of the interlayer insulating film 23 may be silicon oxide, phosphosilicate glass (PSG), borophosphosilicate glass (BPSG), spin on glass (SOG) or the like. The electrode and wiring 25 may be made of, for example, a lamination of a Ti layer, a TiN layer and an Al layer.

In the embodiment described above, although the side wall spacers are formed on the whole area of the side walls of the gate electrode, side wall spacers having a lower height may be formed to further reduce the resistance of the gate electrode. This embodiment will be described with reference to FIGS. 3A to 3F.

Figure 3A:
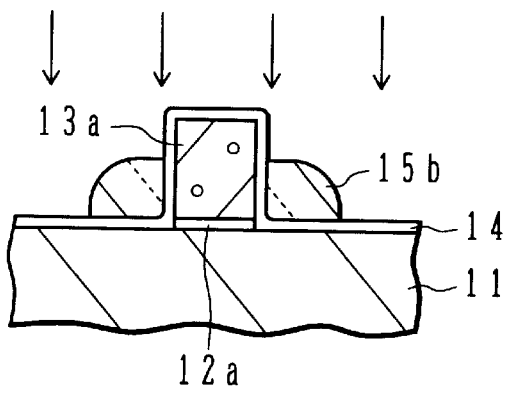
FIGS. 3A to 3F are cross sectional views of a silicon substrate illustrating main processes of a method of manufacturing a semiconductor device according to another embodiment of the invention.

As shown in FIG. 3A, after the processes of the first embodiment are performed to the process shown in FIG. 1E, RIE further continues to etch the $SiO_2$ film 15 to the position lower than the upper surface of the gate electrode 13a. Therefore, the upper surface and upper side walls of the gate electrode 13a are covered only with the TiN film 14.

Figure 3D:
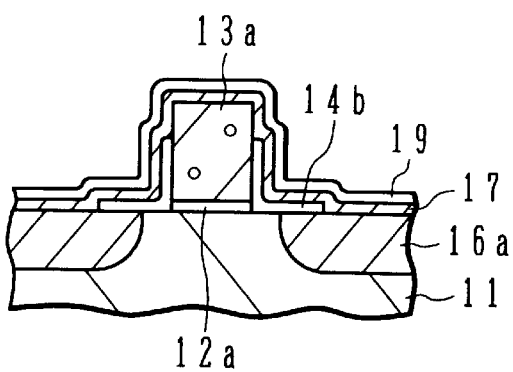
Figure 3B:
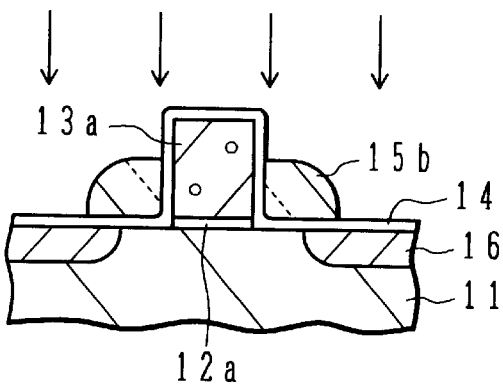

As shown in FIG. 3B, similar to the process shown in FIG. 1E, impurity ions are implanted to form the impurity doped regions 16, and also implanted into the gate electrode 13a, by using as a mask the gate electrode 13a, TiN film 14, and side wall spacers 15b on the gate electrode 13a.

After impurity ions are implanted, a heat treatment is performed to activate the implanted impurities. Therefore, high impurity concentration regions 16a for source/drain regions are formed in the substrate 11 and the impurities in the gate electrode are also activated. Thereafter, as shown in FIG. 3C, the exposed TiN film 14 not covered with the side wall spacers 15b is removed by sulfuric acid or the like to form a TiN pattern 14b. The side wall spacers 15b are removed by diluted hydrofluoric acid or the like. The left TiN pattern 14b is used as a mask for the silicidation process.

As shown in FIG. 3D, a Co film 17 and a protective TiN film 19 are deposited over the substrate surface to cover the gate electrode 13a and TiN pattern 14b.

Figure 3E:
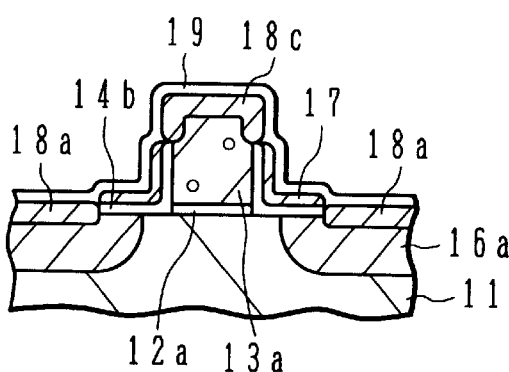
Figure 3C:
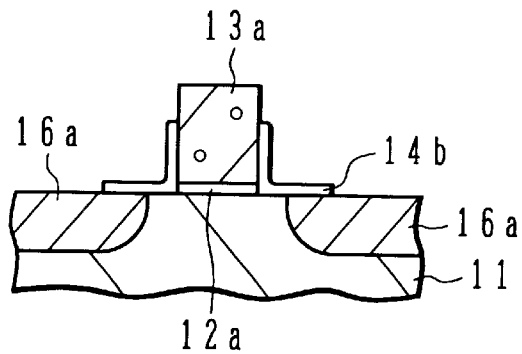

As shown in FIG. 3E, a heat treatment for the first silicidation reaction is performed under the same conditions as the first embodiment. In the second embodiment, the Co film 17 not only covers the upper surface of the gate electrode 13a but also is direct contact with the upper side walls of the gate electrode 13a. Therefore, a silicide film 18c is formed on the upper surface and upper side walls of the gate electrode 13a. Silicide films 18a on the source/drain regions 16a are formed in the manner similar to the first embodiment.

Figure 3F:
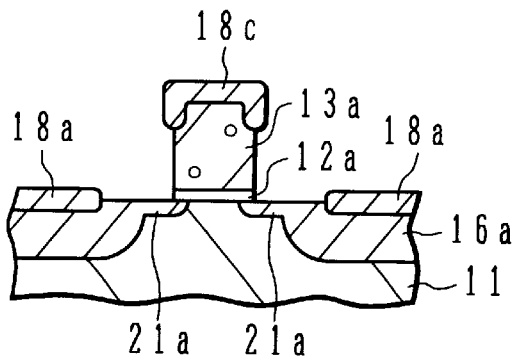

As shown in FIG. 3F, the TiN film 19, unreacted Co film 17 and TiN pattern 14b used as the mask are removed by sulfuric acid. Thereafter, by using the gate electrode as a mask, impurity ions are implanted at a low concentration to form low impurity concentration regions 21a of the LDD structure.

After the ion implantation, an annealing process is executed for both the activation of the impurities of the low impurity concentration regions 21a and the heat treatment for the second silicidation reaction. The optimum conditions for the second silicidation reaction are the same as the first embodiment.

MOS transistors formed by the above method can be used for various types of semiconductor integrated circuits.

Figure 6A:
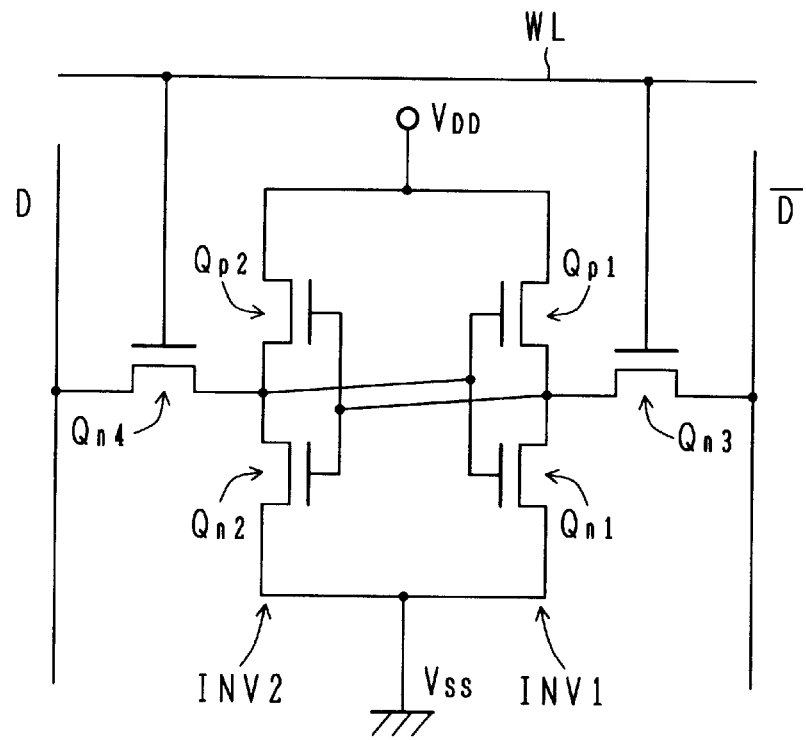
FIGS. 6A and 6B are an equivalent circuit and a plan view of an example of a semiconductor device embodying the present invention.
Figure 6B:
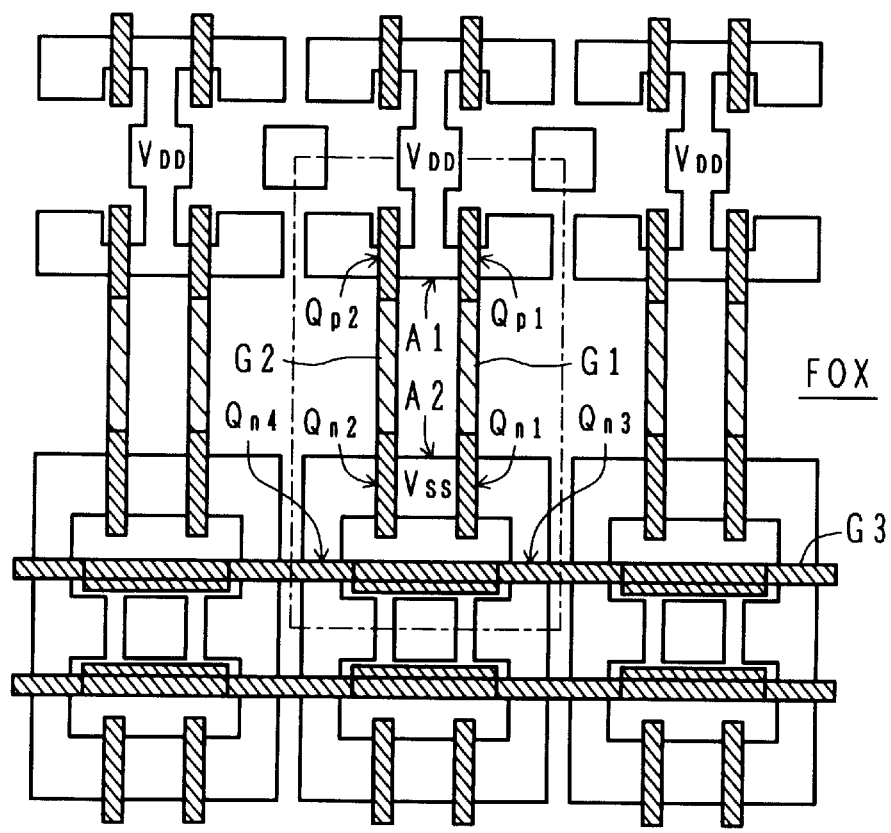

FIGS. 6A and 6B show an SRAM device as one example of a semiconductor integrated circuit.

FIG. 6A is an equivalent circuit of one SRAM cell, and FIG. 6B is a plan view showing the layout of a semiconductor wafer.

Referring to FIG. 6A, a p-channel MOS transistor Qp1 and an n-channel MOS transistor Qn1 are serially connected to form a first inverter circuit INV1.

Similarly, a p-channel MOS transistor Qp2 and an n-channel MOS transistor Qn2 are serially connected to form a second inverter circuit INV2. These inverter circuits INV1 and INV2 are connected in parallel between power supply voltages Vdd and Vss. An output point of the first inverter circuit INV1 is connected to the gate electrode of the second inverter circuit INV2. Similarly, an output point of the second inverter circuit INV2 is connected to the gate electrode of the first inverter circuit INV1.

A transfer gate made of an n-channel MOS transistor Qn3 is connected between the output point of the inverter circuit INV1 and a bit line -D. Similarly, a transfer gate made of an n-channel MOS transistor Qn4 is connected to the output point of the inverter circuit INV2 and a bit line D. The gate electrodes of these transfer gate transistors Qn3 and Qn4 are connected to a word line WL. A load transistor Qp as a load of each inverter circuit INV may be replaced by a high resistance element.

FIG. 6B is a plan view showing an example of the wafer plane structure realizing the SRAM circuit shown in FIG. 6A. Active regions A1 and A2 are formed on the semiconductor wafer surface, the peripheries of which are surrounded by a field oxide film FOX. An area surrounded by one-dot chain line in FIG. 6B shows one SRAM cell. In the vertical direction, SRAM cells are disposed with their directions being alternately reversed to thereby use power supply lines Vdd and Vss in common. In the horizontal direction, SRAM cells having the same structure are juxtaposed.

Gate electrodes G1 and G2 traverse a partial area of the active region A1 and also a partial area of the active region A2. Under the gate electrode G1 in the active region A1, the p-channel MOS transistor Qp1 is formed, and under the gate electrode G2 in the active region A1, the other p-channel MOS transistor Qp2 is formed. Under the gate electrode G1 in the active region A2, the n-channel MOS transistor Qn1 is formed, and under the gate electrode G2 in the active region A2, the other n-channel MOS transistor Qn2 is formed.

In the lower area of the active region A2, another gate electrode G3 is formed in the horizontal direction, and the n-channel transfer gate transistors Qn3 and Qn4 are formed under the gate electrode G3. The gate electrode G3 is used also as the word line Wl shown in FIG. 6A.

The present invention has been described in connection with the preferred embodiments. The invention is not limited only to the above embodiments. For example, the metal for making silicide may be Co, Ti, Pt, Ni, W or a mixture thereof. The gate electrode may not be a single silicon layer, for example polycide or metal. In this case silicide formation is made only on the substrate surface. It will be apparent to those skilled in the art that various modifications, improvements, combinations, and the like can be made.

What is claimed is:

1. A method of manufacturing a semiconductor device comprising the steps of:

(a) forming an insulated gate electrode on a surface of a silicon substrate;

(b) laminating two or more films made of materials having different etching characteristics on the surface of the silicon substrate, the films covering the insulated gate electrode;

(c) anisotropically etching part of the two or more films using at least one of the two or more films which remains as an etching stopper, covering the insulated gate and the silicon substrate thereby forming side wall spacers on side walls of the insulated gate electrode with said part of the two or more films;

(d) implanting impurity ions into the surface of the silicon substrate by using a mask the insulated gate electrode and the side wall spacers;

(e) activating the implanted impurities to a first level;

(f) removing the at-least-one film exposed outside the side wall spacers to expose an upper surface of the insulated gate electrode and a partial surface area of the silicon substrate;

(g) forming a metal film capable of being silicided on the surface of the silicon substrate, the metal film covering the exposed surface of the silicon substrate and the insulated gate electrode;

(h) performing a first silicidation reaction between the metal film and the exposed surface of the silicon substrate;

(i) removing the unreacted portion of the metal film and the remaining at-least-one film under the unreacted portion;

(j) implanting impurity ions shallowly in the surface layer of the silicon substrate by using as a mask the insulated gate electrode; and (k) activating the shallowly implanted impurities to a second level lower than the first level to perform at a same time a second silicidation reaction for silicide formed by the first silicidation reaction, wherein the above steps are carried out in this order.

2. A method according to claim 1, further comprising a step of (l) removing the side wall spacers between said steps (f) and (j).

3. A method according to claim 1, wherein the insulated gate electrode includes a gate insulating film formed on the surface of the silicon substrate and a silicon layer formed on the gate insulating film, said step (f) exposes at least the upper surface of the silicon layer, and said step (h) performs the first silicidation reaction also between the metal film and the silicon layer.

4. A method according to claim 3, wherein said step (c) removes said part of the two or more films also on upper side walls of the insulated gate electrode, while leaving said at-least-one film, and said step (f) exposes the upper surface and upper side surfaces of the silicon layer.

5. A method according to claim 1, wherein said step (k) is performed at a temperature lower than a temperature used at said step (h).

6. A method according to claim 1, wherein the at-least-one film is made of TiN.

7. A method according to claim 1, wherein said part of the two or more films include a silicon oxide film.

8. A method according to claim 1, wherein said step (j) uses $BF_2$ or decaborane as an impurity source.

9. A method according to claim 8, wherein said step (j) is performed at an acceleration energy of 5 keV or lower.

10. A method according to claim 1, wherein the metal film capable of being silicided is made of Co, Ti, Pt, Ni, W or a mixture thereof.

11. A method according to claim 1, wherein said step (e) is performed at a temperature of 1000° C. or higher, and said step (k) is performed at a temperature of 950° C. or lower.

12. A method according to claim 1, wherein the metal film capable of being silicided is made of Co, and said step (h) silicides Co to Co silicide not including $CoSi_2$ under a condition satisfying:

$$y2 \leqq y \leqq y1$$

where $y=10^4/t$, T is a temperature in degrees Kelvin, t is a time in seconds, k is the Boltzmann's constant, $y1=3.02 \times 10^{13} \times \exp[-1.64 \text{ eV}/kT]$, and $y2=1.82 \times 10^{15} \times \exp[-2.19 \text{ eV}/kT]$.

13. A method according to claim 12, wherein said step (k) silicides Co to $CoSi_2$ by heating the silicon substrate under a second condition of a temperature range of ±50° K. around $10^4/t=1.1 \times 10^{14} \exp[-2.65/kT]$ wherein T is a temperature in degrees Kelvin and t is a time in seconds.

* * * * *